United States Patent [19]

Lyon et al.

[11] Patent Number: 5,175,547
[45] Date of Patent: Dec. 29, 1992

[54] METHOD AND APPARATUS FOR TESTING AN ANALOG TO DIGITAL CONVERTER

[75] Inventors: Jose A. Lyon; Jules D. Campbell, Jr., both of Austin, Tex.

[73] Assignee: Motorola, Inc., Schaumburg, Ill.

[21] Appl. No.: 829,136

[22] Filed: Jan. 31, 1992

[51] Int. Cl.⁵ .............................................. H03M 1/10
[52] U.S. Cl. ................................... 341/120; 324/548
[58] Field of Search ................... 341/120, 155, 172; 324/72, 133, 548

[56] References Cited

U.S. PATENT DOCUMENTS

| | | | |
|---|---|---|---|
| 3,653,037 | 3/1972 | Utley | 341/120 |
| 3,919,504 | 11/1975 | Crosley et al. | 179/175.2 |
| 4,625,310 | 11/1986 | Mercer | 371/15 |
| 4,674,090 | 6/1987 | Chen et al. | 371/25 |
| 4,724,341 | 2/1988 | Yamada et al. | 307/449 |
| 4,789,825 | 12/1988 | Carelli et al. | 324/158 |
| 4,795,963 | 1/1989 | Ueno et al. | 341/120 |
| 4,805,063 | 2/1989 | Kataoka et al. | 324/548 |
| 4,893,311 | 1/1990 | Hunter et al. | 371/22.5 |
| 4,972,144 | 11/1990 | Lyon et al. | 324/158 T |
| 5,063,383 | 11/1991 | Bobba | 341/120 |

FOREIGN PATENT DOCUMENTS 35661  2/1987  Japan .......................... 324/158 T Primary Examiner—Marc Hoff
Attorney, Agent, or Firm—Susan C. Hill

[57] ABSTRACT

A method and apparatus for testing an analog to digital converter (14) having a capacitor digital to analog converter (30). In one form, the analog to digital converter uses a small amount of capacitor test logic (44) to test for opens and shorts in the capacitor array (42), the switch logic (38), and the decode logic (36). Instead of performing time-consuming analog to digital conversions, the functionality of the above mentioned circuitry is tested by using AND and OR logical functions. As a result of using capacitor test logic (44), a very quick pass/fail functional test can be performed on the analog to digital converter (14) without requiring the analog to digital converter (14) to perform time-consuming analog to digital conversions.

20 Claims, 5 Drawing Sheets

METHOD AND APPARATUS FOR TESTING AN ANALOG TO DIGITAL CONVERTER

REFERENCE TO RELATED APPLICATIONS

The present application is related to the following U.S. patent application which is filed of even date herewith:

Ser. No. 07/829,113, titled "A Method and Apparatus for Testing an Analog to Digital Converter".

FIELD OF THE INVENTION

The present invention relates in general to analog to digital converters (ADCs), and more particularly to testing ADCs.

BACKGROUND OF THE INVENTION

Analog to digital converters (ADCs) are used to convert an analog input signal to an equivalent digital output signal. ADCs are required in a variety of applications where an analog signal must be converted to a digital signal in order to allow digital data processing.

Most digital data processing systems are not able to directly use an analog signal. Therefore, most analog values must be converted to an equivalent digital value by an ADC before a digital system can use the value. As a consequence, most digital data processing systems include an ADC if analog values are to be received by the system. Some microcomputer chips even include an ADC on board the microcomputer chip.

Fault grading is performed on a semiconductor chip design in order to increase reliability. The goal of fault grading is to generate tests which fully exercise all of the thousands or millions of individual devices and nodes within the chip in order to ensure that all of the devices and nodes function properly. Fault grading increases the reliability of chips which are manufactured using the fault graded design.

One set of nodes that is difficult to fault grade in a chip design is the first electrode of the capacitors used in an ADC. Fault grading of this set of nodes not only allows the capacitors themselves to be tested for various types of shorts, but in addition, allows the drive logic used to drive the first electrode of each capacitor to be tested. If resistors are used in place of some or all of the capacitors, then the set of nodes that is difficult to fault grade is the intermediate nodes between each resistive value. One of the reasons for the difficulty is that the voltages on these nodes are not digital voltages, but rather are analog voltages.

It is difficult to test and fault grade an analog structure such as the capacitors and resistors used in an ADC because the normal inputs to these analog structures are analog voltages. These analog input voltages cannot easily be generated with digital test equipment that uses only digital inputs and outputs. The digital testing equipment for a digital data processing system, such as a microcomputer chip, uses primarily digital input and output signals. The testing equipment may be able to use analog input and output signals, but such analog testing generally requires more testing time. Thus it is generally more efficient and less costly to perform tests that use digital rather than analog input and output signals.

In addition to fault grading the ADC design, each ADC chip that is manufactured must be individually tested using a linearity test, such as a full ramp test. This linearity test uses analog inputs to test the accuracy of the ADC over the full range of possible input and output values. A linearity test requires the ADC to perform hundreds or thousands of time-consuming analog to digital conversions. Linearity testing requires a great deal of time and is thus very costly. Therefore, it is desirable to find a way to test ADCs that requires less time, uses minimal additional circuitry in the ADC, and uses digital rather than analog inputs.

In present ADCs, the linearity test is often the only test method used to determine if the capacitors and/or resistors are defective. A linearity test requires the ADC to perform an analog to digital conversion for every inputted analog value. A partial linearity test is a linearity test which uses as inputs only a selected group of analog values within the input signal range. Although a partial linearity test is used to save test time in determining if the capacitors and/or resistors are defective, it still requires a significant number of analog to digital conversions.

A defect in the capacitors and/or resistors which determine the most significant bits of the digital output is easy to detect using a partial linearity test because an error in the most significant bits will not be masked by small errors due to other causes. However, a defect in the capacitors and/or resistors which determine the least significant bits of the digital output is harder to detect because an error in the least significant bits may be masked by small errors due to other causes, such as component mismatch. As a result, defects in certain ADC capacitors and resistors are difficult to detect a using a partial linearity test. Thus linearity tests, including partial linearity tests, are time consuming, costly, and may have trouble catching defects in certain ADC capacitors and resistors.

SUMMARY OF THE INVENTION

The previously mentioned needs are fulfilled and other advantages achieved with the present invention. In one form, the present invention comprises an apparatus and a method for testing an analog to digital converter which has a plurality of capacitors. Each of the capacitors has a first capacitor electrode and a second capacitor electrode.

First logic is coupled to the first capacitor electrode of each capacitor for performing a first test to detect whether any of the first capacitor electrodes are permanently fixed at a logic level zero. The first logic also generates a first test result in response to the first test. Second logic is coupled to the first capacitor electrode of each capacitor for performing a second test to detect whether any of the first capacitor electrodes are permanently fixed at a logic level one. The second logic also generates a second test result in response to the second test. Third logic is coupled to the first and second logic and transmits the first test result and the second test result.

The present invention will be understood by one skilled in the art from the detailed description below in conjunction with the accompanying drawings.

DESCRIPTION OF THE PREFERRED EMBODIMENT

One possible solution to the above-mentioned problems is a basic digital functional test that can determine functionality of key ADC circuitry without requiring any time-consuming analog to digital conversions. If a very quick, basic digital functional test is performed first, it will be able to detect defects and reject defective ADCs before any time-consuming linearity tests are performed. Note that linearity testing may still be required to test the accuracy of an ADC that has passed the basic digital functional test. But, by using a basic digital functional test first, costly linearity testing will not be wasted on ADCs that have basic defects and must be rejected.

Thus, a way to test analog structures in an ADC using digital inputs and outputs was needed. The present invention allows a fast, inexpensive, and more reliable test to be performed on an ADC in order to determine if some of the fundamental circuitry, including analog circuitry, is functional. In the past, a time consuming and expensive linearity test using analog inputs was required in order to find the same types of errors. In addition, fault grading to catch these types of error was extremely difficult.

The terms "assert" and "negate" will be used when referring to the rendering of a signal or similar apparatus into its logically true or logically false state, respectively. The term "logic level zero" will be used when referring to a digital voltage level that corresponds to a binary value of "0". The term "logic level one" will be used when referring to a digital voltage level that corresponds to a binary value of "1".

Figure 1:
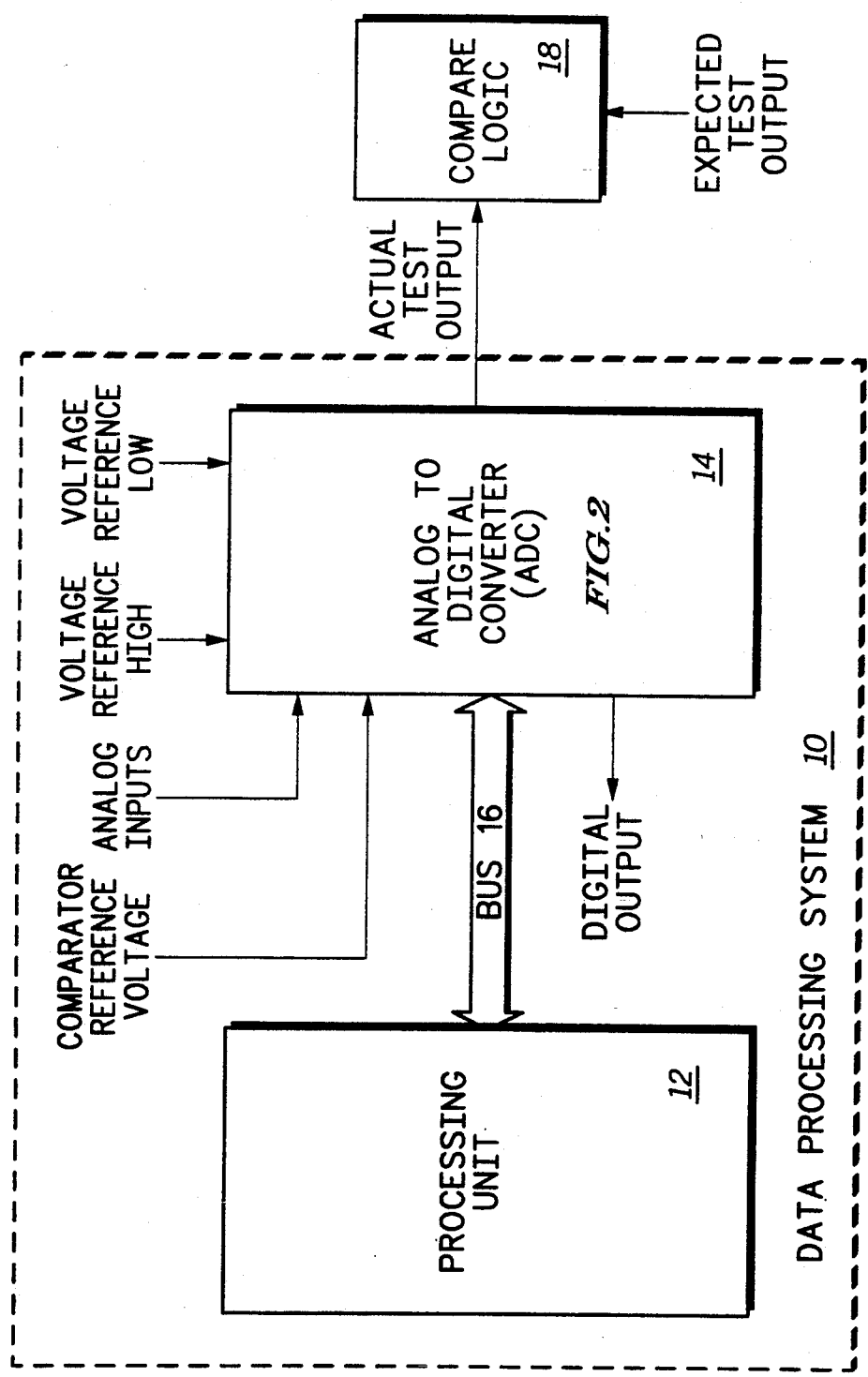
FIG. 1 illustrates, in block diagram form, a data processing system having an analog to digital converter (ADC) in accordance with one embodiment of the present invention.

FIG. 1 illustrates a data processing system 10 which has a processing unit 12 and an analog to digital converter (ADC) 14. A bus 16 transfers information between processing unit 12 and ADC 14. The ADC 14 receives four input signals: an analog input, a comparator reference voltage, a voltage reference high, and a voltage reference low.

The ADC 14 receives the analog input signal and converts it to a digital output signal that is equivalent. This digital output signal may be used internally by another portion (not shown) of the data processing system 10. In one embodiment of the present invention, the digital output is transmitted to the processing unit 12 across bus 16. Also, the digital output may be sent outside the data processing system 10 for use by external devices (not shown). In addition, the digital output may be a serial bus consisting of one conductor, or may be a parallel bus consisting of multiple conductors.

The ADC 14 also generates an output signal called actual test output. Compare logic 18 receives the actual test output signal as well as an expected test output signal. Compare logic 18 compares the actual test output to the expected test output in order to determine if they are the same. If the actual test output is different than the expected test output, then there is an error or defect in ADC 14. Although compare logic 18 is shown as external to data processing system 10, compare logic 18 may alternately be part of data processing system 10, and may even be part of ADC 14. In one embodiment, the compare logic 18 is part of an external testing apparatus (not shown).

Figure 2:
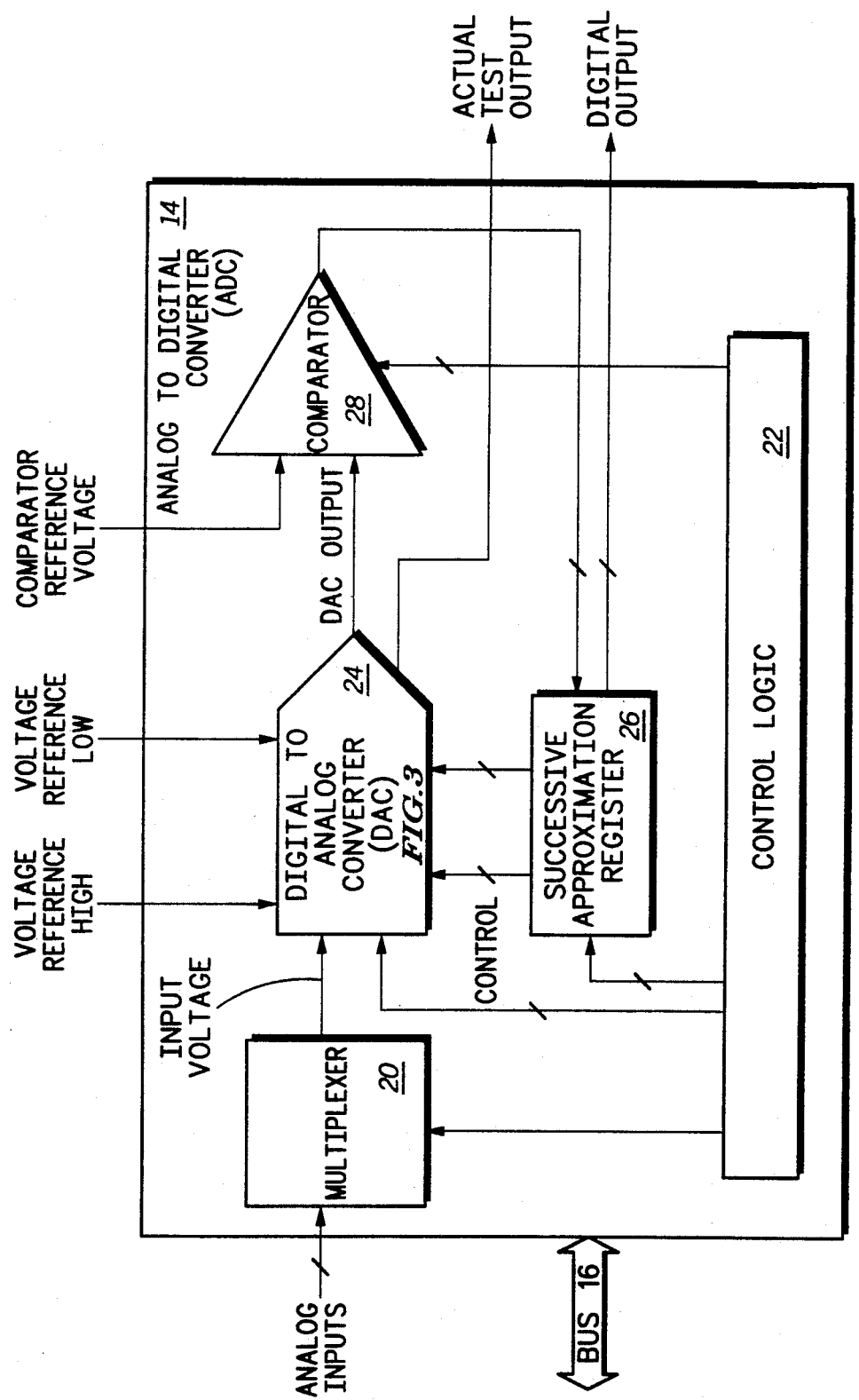
FIG. 2 illustrates, in block diagram form, an ADC of FIG. 1 in accordance with one embodiment of the present invention.

FIG. 2 illustrates one implementation of the analog to digital converter (ADC) 14 of FIG. 1. The bus 16 is used to transmit information to and from ADC 14. A multiplexer 20 receives a control input from control logic circuitry 22. The multiplexer 20 uses this control input to determine which analog input signal is to be outputted to a digital to analog converter (DAC) 24 as an input voltage signal. In addition, DAC 24 receives control signals from control logic 22. The voltage reference high and voltage reference low signals are also inputs to DAC 24. Finally, DAC 24 receives the most recent successive approximation value from a successive approximation register 26.

The successive approximation register 26 receives control information from control logic 22 which is used to determine the new value stored in the successive approximation register 26. Successive approximation register 26 also outputs a digital output that is the result of the analog to digital conversion. In addition, successive approximation register 26 can also be read and written to across bus 16. In the present embodiment, writes from the processing unit 12 to the successive approximation register 26 can only take place when ADC 14 is in a special test mode.

Comparator 28 receives the comparator reference voltage, the DAC output from the DAC 24, and control signals from the control logic 22. Comparator 28 compares the values of the comparator reference voltage and the DAC output and sends control signals to the successive approximation register 26 based on the result of the comparison.

The DAC 24 also generates a test output signal called actual test output. Aside from this special test signal and the circuitry used to generate it, the ADC 14 operates to convert analog inputs to eqiuvalent digital outputs in the same manner as a standard analog to digital converter using successive approximation.

Figure 3:
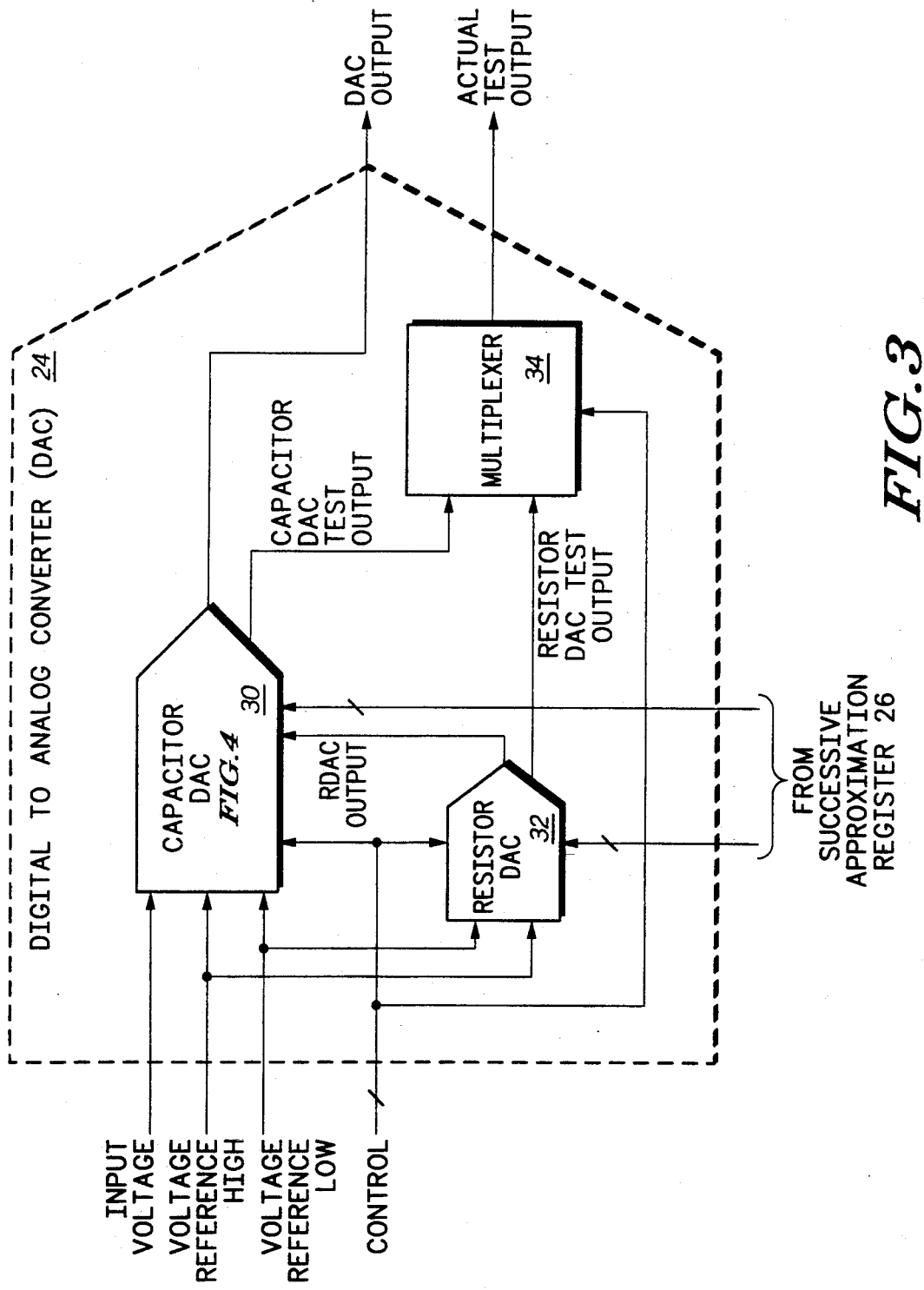
FIG. 3 illustrates, in block diagram form, a digital to analog converter (DAC) of FIG. 2 in accordance with one embodiment of the present invention.

FIG. 3 illustrates one implementation of the digital to analog converter (DAC) 24 of FIG. 2. A capacitor DAC 30 receives the input voltage, the reference voltage high, the reference voltage low, and control signals as inputs. A resistor DAC 32 receives the reference voltage high, the reference voltage low, and control signals as inputs. An output of the resistor DAC 32, called RDAC output, is an input to capacitor DAC 30. Both capacitor DAC 30 and resistor DAC 32 receive inputs from the successive approximation register 26.

In the present embodiment, the resistor DAC 32 receives the lower order bits and the capacitor DAC 30 receives the higher order bits from the successive approximation register 26. A multiplexer 34 receives a capacitor DAC test output signal from capacitor DAC 30, and a resistor DAC test output signal from resistor DAC 32. Multiplexer 34 also receives a control signal that it uses to select which of its two input signals to output as the actual test output signal. Capacitor DAC 30 also outputs a DAC output signal.

Figure 4:
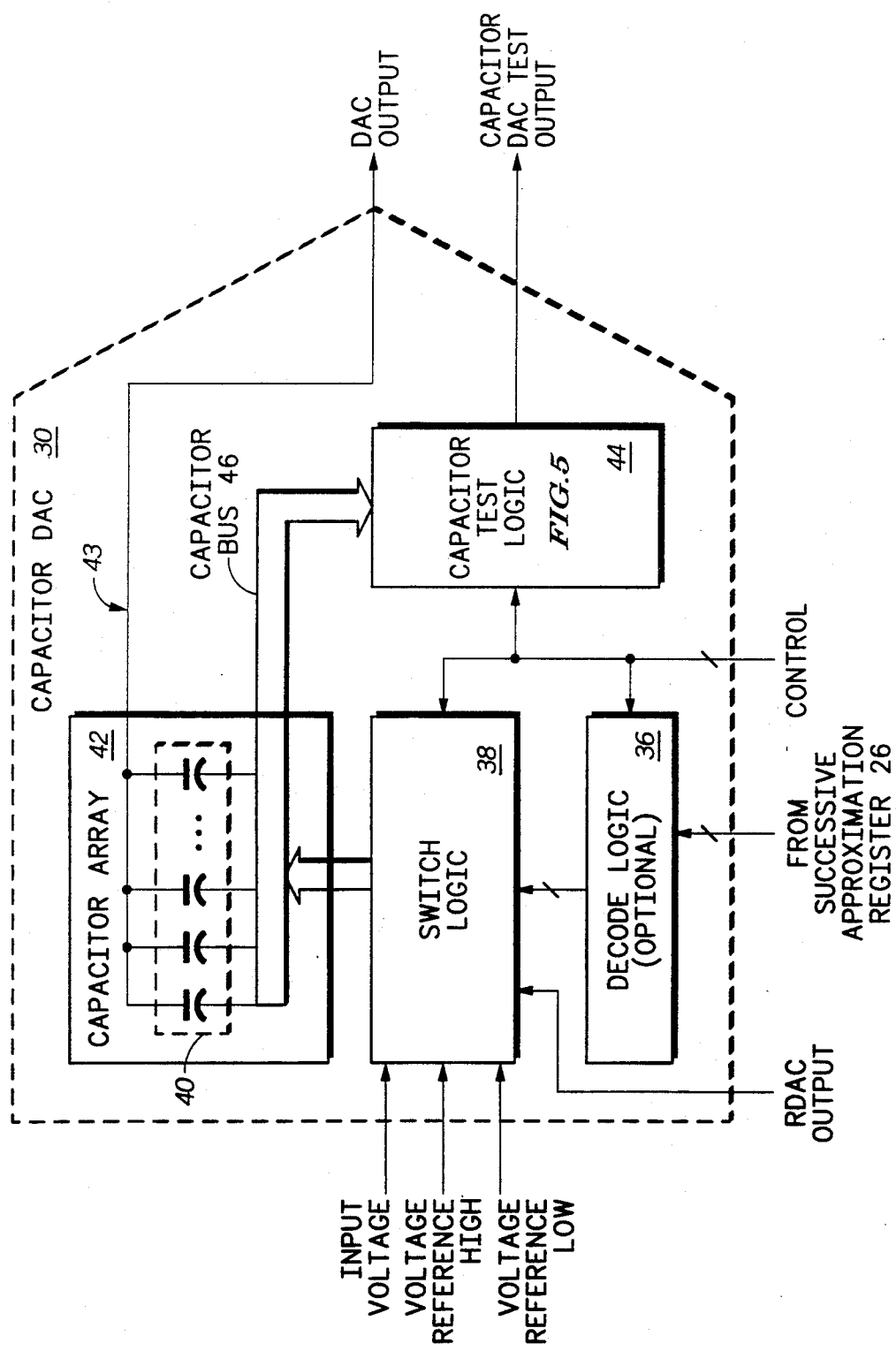
FIG. 4 illustrates, in partial logic diagram form, a capacitor DAC of FIG. 3 in accordance with one embodiment of the present invention.

FIG. 4 illustrates one implementation of the capacitor DAC 30 of FIG. 3. Decode logic 36 is optional. If decode logic 36 is used, it receives inputs from the successive approximation register 26, decodes these inputs, and transmits output signals to switch logic 38. If the decode logic 36 is not used, then switch logic 38 directly receives the signals from the successive approximation register 26. Switch logic 38 also receives RDAC output.

Switch logic 38 operates as an analog switch. Switch logic 38 uses the inputs that it receives to determine which voltages to place on the first electrodes of the capacitors 40 in capacitor array 42. Switch logic 38 receives three possible voltages, namely the input voltage, the voltage reference high, and the voltage reference low, that can be individually placed on the first electrode of each of the capacitors 40 in capacitor array 42.

Capacitor array 42 contains "N" capacitors 40 where "N" is any positive integer number. Each of the capacitors 40 in capacitor array 42 has a first capacitor electrode and a second capacitor electrode. The second electrodes of all of the capacitors are connected to the same electrical node 43. Consequently, all of the second capacitor electrodes will have the same voltage, although the value of that voltage can vary. For example, if the electrical node 43 is at four volts, the second capacitor electrode of all of the capacitors will be at four volts. And likewise, if the electrical node 43 is at five volts, the second capacitor electrode of all of the capacitors will be at five volts. The output signal labelled DAC output is also electrically tied to this same node 43.

The first capacitor electrodes are not connected to the same electrical node. The first electrode of each capacitor 40 is separately connected to one output conductor from the switch logic 38. Switch logic 38 uses the value from the successive approximation register 26 to determine which voltage to place on the first electrode of each of the capacitors 40. The value from the successive approximation register 26 may be decoded by the optional decode logic 36 before it is received by the switch logic 38; or alternatively, the switch logic 38 may directly receive the value from the successive approximation register 26.

The first electrode of each capacitor 40 is also separately connected to one input conductor which goes to capacitor test logic circuitry 44. Collectively, the bundle of conductors between the first electrode of each capacitor 40 and the capacitor test logic 44 is labelled capacitor bus 46. Capacitor bus 46 has "N" conductors: one conductor for each capacitor 40. Capacitor test logic 44 outputs a signal labelled capacitor DAC test output. The optional decode logic 36, the switch logic 38, and the capacitor test logic 44 all receive control signals as inputs. Aside from the capacitor test logic 44, the capacitor bus 46, and the capacitor DAC test output, the logic in capacitor DAC 30 operates in the same manner as prior art devices.

If a binary weighted structure is used in the capacitor DAC 30, then there is a one-to-one correspondence between each of the successive approximation register 26 bits and each of the capacitors 40. Therefore, in a binary weighted DAC structure, it is possible to pinpoint the location of a defective structural element by writing a pattern of "walking ones" and "walking zeros" to the successive approximation register 26 bits.

If a non-binary weighted structure is used in the capacitor DAC 30, then there is not a one-to-one correspondence between each of the successive approximation register 26 bits and each of the capacitors 40. However, in a non-binary weighted DAC structure, it is still possible to determine the location of certain defective structural elements by writing selected patterns of ones and zeros to the successive approximation register 26 bits.

Figure 5:
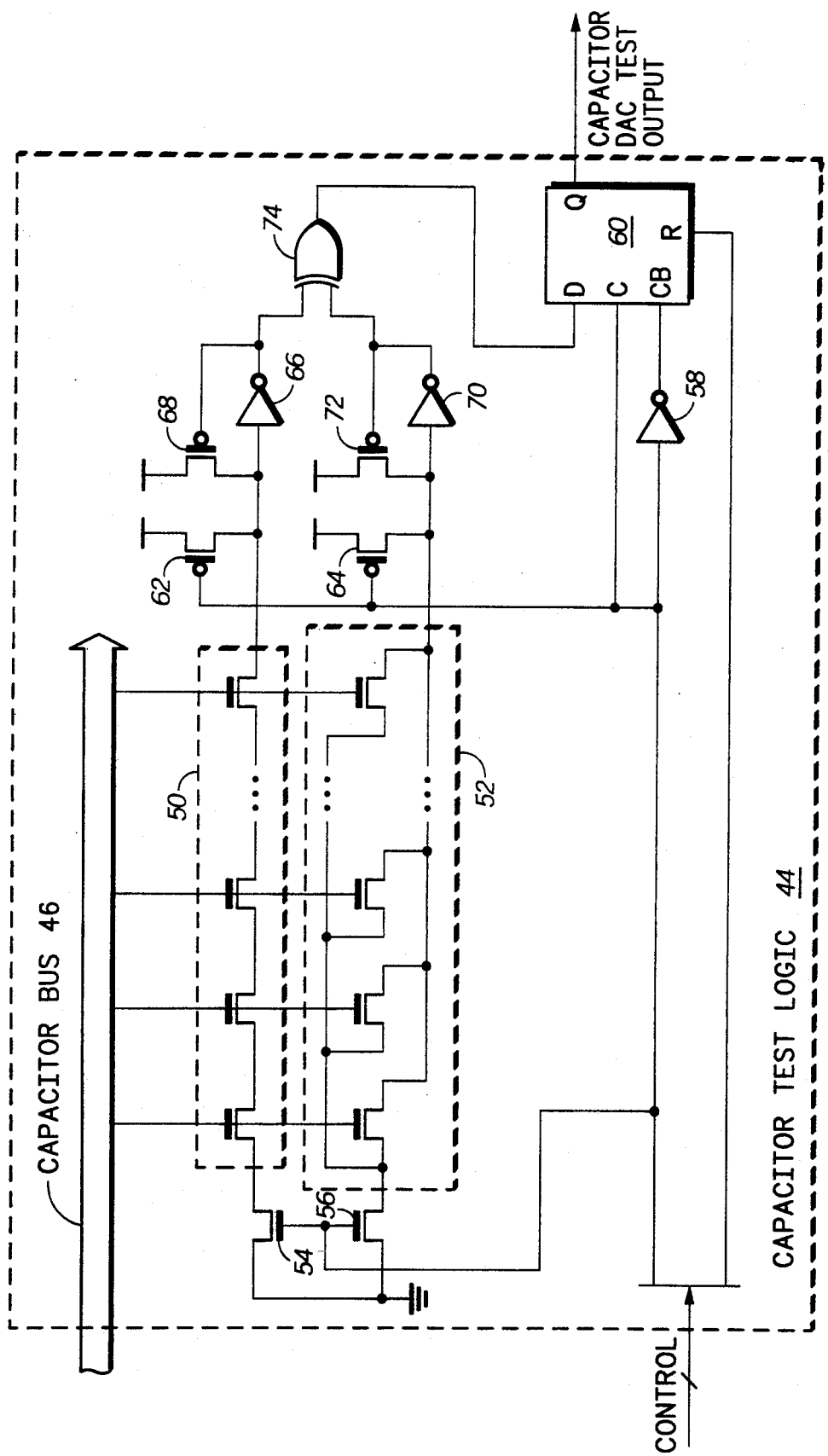
FIG. 5 illustrates, in logic diagram form, a capacitor test logic circuit of FIG. 4 in accordance with one embodiment of the present invention.

FIG. 5 illustrates one implementation of the capacitor test logic 44 of FIG. 4. Series transistors 50 consists of "N" n-channel MOSFET transistors which are electrically coupled to each other in series. Parallel transistors 52 consists of "N" n-channel MOSFET transistors which are electrically coupled to each other in parallel. Each of the "N" conductors in capacitor bus 46 is electrically coupled to a gate of one transistor in series transistors 50 and to a gate of one transistor in parallel transistors 52. N-channel transistor 54 has a source coupled to ground, a drain coupled to series transistors 50, and a gate coupled to a first control signal. N-channel transistor 56 has a source coupled to ground, a drain coupled to parallel transistors 52, and a gate coupled to the first control signal.

The first control signal is also an input to an inverter 58, to a clock input (C) of a D-flip-flop 60, to a gate of a p-channel MOSFET transistor 62, and to a gate of a p-channel MOSFET transistor 64. A second control signal is an input to the reset input (R) of D-flip-flop 60. An output of inverter 58 is an input to a clockbar input (CB) of D-flip-flop 60. Transistor 62 has a source coupled to a positive power supply voltage and a drain coupled to series transistors 50, an input of inverter 66, and a drain of p-channel MOSFET transistor 68. P-channel MOSFET transistor 68 has a source coupled to a positive power supply voltage and a gate coupled to an output of inverter 66.

Transistor 64 has a source coupled to a positive power supply voltage and a drain coupled to parallel transistors 52, an input of inverter 70, and a drain of p-channel MOSFET transistor 72. Transistor 72 has a source coupled to a positive power supply voltage and a gate coupled to an output of inverter 70. The output of inverter 70 and the output of inverter 66 are both inputs to exclusive-OR gate 74. An output of exclusive-OR gate 74 is an input to the D input of D-flip-flop 60. Q output of D-flip-flop 60 is a signal labelled capacitor DAC test output.

In operation, the capacitor test logic 44 can be used to test the capacitors themselves for various types of shorts. In addition, capacitor test logic 44 can be used to test the drive logic which drives the first electrodes of the capacitors. A logical "AND" function is used to test whether the node at the first electrode of each capacitor is "stuck at zero". A logical "OR" function is used to test whether the node at the first electrode of each capacitor is "stuck at one".

In the present embodiment, the "AND" function is implemented using a first clocked logic gate which includes N-channel transistor 54, series transistors 50, p-channel MOSFET transistor 62, p-channel MOSFET transistor 68, and inverter 66. In the present embodiment, the "OR" function is implemented using a second clocked logic gate which includes N-channel transistor 56, parallel transistors 52, p-channel MOSFET transistor 64, p-channel MOSFET transistor 72, and inverter 70. The output of the "AND" function and the output of the "OR" function are exclusive-ORed (XORed) together using exclusive-OR gate 74.

The following table describes the outputs of the logical "AND" function, the logical "OR" function, and the logical "XOR" function for both the "stuck at zero" test and the "stuck at one" test. The normal case in the left-hand column indicates values which show that the capacitors and drive logic are operating normally. The failure case in the right-hand column indicates values which show that the capacitors and drive logic have failed to operate as expected. The successive approximation register 26, shown in FIG. 2, can be written to across bus 16. Switch logic 38, shown in FIG. 4, then uses the value written into the successive approximation register 26 to determine which voltage to place on the first electrode of each of the capacitors 40. Thus, using the successive approximation register 26, the first electrodes of capacitors 40 can be initialized to the desired logical state, that is either a logical "0" or a logical "1".

| Normal Case | Failure Case |
|---|---|
| Stuck at ZERO Test (first electrodes of capacitors 40 are initialized to logical "1") | |
| AND = 1 | AND = 0 |
| OR = 1 | OR = 1 |
| XOR = 0 | XOR = 1 |
| Stuck at ONE Test (first electrodes of capacitors 40 are initialized to logical "0") | |
| AND = 0 | AND = 0 |
| OR = 0 | OR = 1 |
| XOR = 0 | XOR = 1 |

For both the "stuck at zero" test and the "stuck at one" test, if the output of exclusive-OR gate 74 is a logical "1", there is a failure in either the capacitors themselves or in the drive logic which is used to drive the first electrode of each capacitor. The output of exclusive-OR gate 74 is stored in D-flip-flop 60 and output from D-flip-flop 60 is the signal labelled capacitor DAC test output. If capacitor DAC test output is ever a logical "1", it indicates that there is a failure severe enough to prevent the analog to digital converter (ADC) 14 from operating properly. Thus if capacitor DAC test output is ever a logical "1", the ADC 14 should be considered non-functional and no further time should be wasted on testing the ADC 14.

When ADC 14 is in a special test mode, the first control signal going to the clock input (C) of D-flip-flop 60 is varied between a logic level zero and a logic level one. When the first control signal is a logic level zero, p-channel MOSFET transistors 62 and 64 are conducting and the inputs to inverters 66 and 70 are precharged to a logic level one. In addition, n-channel MOSFET transistors 54 and 56 are not conducting. As a result, whether series transistors 50 and parallel transistors 52 are conducting or not has no effect on the D input of D-flip-flop 60. Thus, the first electrodes of capacitors 40, each of which is coupled to a gate of a series transistor 50 and a parallel transistor 52, have no effect on the D input of D-flip-flop 60.

But, when the first control signal is a logic level one, p-channel MOSFET transistors 62 and 64 are not conducting and therefore have no effect on the inputs to inverters 66 and 70. In addition, n-channel MOSFET transistors 54 and 56 are now conducting. As a result, whether series transistors 50 and parallel transistors 52 are conducting or not determines the D input of D-flip-flop 60. Thus, the first electrodes of capacitors 40, each of which is coupled to a gate of a series transistor 50 and a parallel transistor 52, now determine the D input of D-flip-flop 60. The voltage on each of the first electrodes now affects the capacitor DAC test output signal.

When ADC 14 is not in a special test mode, the first control signal going to the clock input (C) of D-flip-flop 60 is forced to stay at logic level zero. This disables the D-flip-flop 60. It also causes the n-channel MOSFET transistor 54 to disable the "AND" function and causes the n-channel MOSFET transistor 56 to disable the "OR" function. In order to conserve power, capacitor test logic 44 is not enabled except when it is performing its specialized test functions while in special test mode.

If a non-binary weighted DAC structure is used in the digital to analog converter 24 (shown in FIG. 2), then decode logic 36 (shown in FIG. 4) may be required and its functionality must be tested. Capacitor test logic circuitry 44 allows the functionality of decode logic 36 to be tested without the necessity of using a very time consuming full ramp test. It must be noted, however, that if no errors are found using capacitor test logic circuitry 44, that is if capacitor DAC test output is never a logical "1", then a full ramp test may still be required in order to test the linearity of the ADC 14.

Capacitor test logic 44 is not part of the circuitry that is required in order to perform an analog to digital conversion. In fact, capacitor test logic 44 is not used during normal operation, but is only used during a special test mode in order to perform tests that do not require any analog to digital conversions. The purpose of special test mode is to allow basic digital functional testing of ADC 14.

In this special test mode, the reference voltages are changed to be valid digital logic levels. The test output, which is only generated in a special test mode, is also a valid digital logic level. So in the special test mode, only digital voltages are applied to the voltage reference pins as test inputs and only digital voltages are generated as test outputs.

In normal operation, the reference voltages are analog voltages that must meet the following requirements:

$$(VDD-VSS)/2 \leq VRH \leq VDD$$

and $$VSS \leq VRL \leq (VDD-VSS)/2$$

where
VRH = voltage reference high
VRL = voltage reference low
VSS = ground
VDD = positive power supply voltage In the special test mode, the analog voltages (voltage reference high and voltage reference low) are test inputs supplied by digital test equipment. In this special test mode, voltage reference high and voltage reference low must conform to the voltage requirements of valid digital logic levels. In the present embodiment, a digital logic level zero corresponds to a voltage very near to VSS, and a digital logic level one corresponds to a voltage very near to VDD. Because the analog circuitry in capacitor DAC 30 is designed to function using analog voltages, capacitor test logic 44 is needed to detect any defects in the analog circuitry when digital test inputs, rather than analog test inputs, are used.

Capacitor test logic circuitry 44 thus allows a very fast digital functional test of some of the basic analog circuitry of ADC 14 without requiring ADC 14 to perform time consuming analog to digital conversions using analog inputs. Without capacitor test logic circuitry 44, a number of analog to digital conversions would have to be performed by the ADC 14 in order to try and infer from the conversion value whether each capacitor and each capacitor driver indeed operated correctly.

In addition, capacitor test logic circuitry 44 allows fault grading of a set of nodes that is difficult to fault grade in a chip design, namely the first electrode of each capacitor. Fault grading of this set of nodes allows the capacitors 40 to be tested for various types of shorts. Fault grading of this set of nodes also allows the drive logic which drives the first electrodes of the capacitors to be tested.

As was previously mentioned, the analog circuitry can indeed be tested using analog inputs, but special analog test equipment is required and the tests are very time consuming and expensive because of the large number of analog to digital conversions required. Also, testing using analog inputs may not catch certain defects. Thus testing using digital inputs and outputs saves test time, is less expensive, and results in more thorough test coverage.

In summation, for a minimal amount of added circuitry, the testability of ADC 14 has been significantly improved. Very fast basic digital functional tests of some of the circuitry of ADC 14, including analog circuitry, can be performed without requiring ADC 14 to perform time consuming analog to digital conversions. In addition, fault grading of specific circuitry within ADC 14 can be more easily and accurately performed.

While the present invention has been illustrated and described with reference to specific embodiments, further modifications and improvements will occur to those skilled in the art. For example, the data processing system 10 may or may not be contained on a single semiconductor chip. As an example of this, processing unit 12 may be contained on a semiconductor chip and analog to digital converter (ADC) 14 may not be contained on that same semiconductor chip. Although compare logic 18 is shown as external to data processing system 10, compare logic 18 may alternately be part of data processing system 10, and may even be part of ADC 14. In one embodiment, the compare logic 18 is part of an external testing apparatus (not shown). Bus 16 may be a serial bus, a parallel bus, or a time multiplexed bus.

The digital to analog converter (DAC) 24 may internally use only capacitors, or may internally use both capacitors and resistors as is shown in FIG. 3. If DAC 24 only uses capacitors, then resistor DAC 32 is not required, multiplexer 34 is not required, and the capacitor DAC test output signal is the same as the actual test output signal. Capacitor array 42 may or may not use a non-binary weighted structure. The information from the successive approximation register 26 may or may not be decoded by optional decode logic 36 before being input to switch logic 38.

The logical "AND" function used to test whether the node at the first electrode of each capacitor is "stuck at zero" may be implemented in various ways. The logical "OR" function used to test whether the node at the first electrode of each capacitor is "stuck at one" also may be implemented in various ways. The "XOR" function performed by exclusive-OR gate 74 is not required, but is merely used to condense the results of the testing into a single pass/fail signal. In other embodiments of the present invention, the result of the "stuck at zero" test and the result of the "stuck at one" test could be separately transmitted.

It is to be understood, therefore, that this invention is not limited to the particular forms illustrated and that it is intended in the appended claims to cover all modifications that do not depart from the spirit and scope of this invention.

We claim:

1. Test apparatus for testing circuitry in an analog to digital converter (ADC) which has a plurality of capacitors, each of the capacitors having a first capacitor electrode and a second capacitor electrode, the test apparatus comprising:

first logic means coupled to the first capacitor electrode of each capacitor for performing a first test to detect whether any of the first capacitor electrodes are permanently fixed at a logic level zero, and for generating a first test result in response to the first test;

second logic means coupled to the first capacitor electrode of each capacitor for performing a second test to detect whether any of the first capacitor electrodes are permanently fixed at a logic level one, and for generating a second test result in response to the second test; and third logic means coupled to the first and second logic means for transmitting the first test result and the second test result.

2. The test apparatus according to claim 1, further comprising:

fourth logic means coupled to the first capacitor electrode of each capacitor for coupling a predetermined voltage to the first capacitor electrode of each capacitor.

3. The test apparatus according to claim 1 wherein the analog to digital converter (ADC) is located on a semiconductor chip and the test apparatus is also located on the same semiconductor chip.

4. The test apparatus according to claim 1 wherein the first logic means uses a logical AND function to perform the first test.

5. The test apparatus according to claim 1 wherein the second logic means uses a logical OR function to perform the second test.

6. The test apparatus according to claim 1 wherein the third logic means combines the first and second test results into one signal.

7. The test apparatus according to claim 1 wherein the first logic means, the second logic means, and the third logic means are only enabled during a special test mode.

8. The test apparatus according to claim 1 wherein the third logic means uses a logical exclusive-OR function to combine the first and second test results into one signal.

9. In an analog to digital converter (ADC) having a plurality of capacitors, each capacitor having a capacitor electrode, a method for testing an A/D converter comprising the steps of:

configuring the ADC so that the ADC attempts to place a first predetermined logic level on the capacitor electrode of each capacitor; and determining if the capacitor electrode of one or more of the plurality of capacitors is not at the first predetermined logic level.

10. The method according to claim 9 further comprising the step of:

detecting a defect in the ADC if the capacitor electrode of one or more of the plurality of capacitors is not at the first predetermined logic level.

11. The method according to claim 9 wherein the step of determining further comprises the step of:
using a logical AND function.

12. The method according to claim 9 wherein the step of determining further comprises the step of:
using a logical OR function.

13. The method according to claim 9 further comprising the steps of:
configuring the ADC so that the ADC attempts to place a second predetermined logic level on the capacitor electrode of each capacitor; and
determining if the capacitor electrode of one or more of the plurality of capacitors is not at the second predetermined logic level.

14. In a digital data processor having an analog to digital converter (ADC), the ADC having a plurality of capacitors, each capacitor having a first capacitor electrode and a second capacitor electrode, a method for testing the functionality of the A/D converter comprising the steps of:
configuring the ADC so that the ADC attempts to place a logic level one on the first capacitor electrode of each capacitor;
detecting a stuck at logic level zero failure if the first capacitor electrode of one or more of the plurality of capacitor is actually at a logic level zero;
configuring the ADC so that the ADC attempts to place a logic level zero on the first capacitor electrode of each capacitor; and
detecting a stuck at logic level one failure if the first capacitor electrode of one or more of the plurality of capacitors is actually at a logic level one.

15. The method according to claim 14 wherein the step of detecting the stuck at logic level zero failure further comprises the step of:
using a logical AND function.

16. The method according to claim 15 wherein the step of using a logical AND function further comprises the step of:
ANDing together actual logic levels of the first capacitor electrode of each capacitor to produce a first output where the stuck at logic level zero failure is detected if the first output is at logic level zero.

17. The method according to claim 14 wherein the step of detecting the stuck at logic level one failure further comprises the step of:
using a logical OR function.

18. The method according to claim 17 wherein the step of using a logical OR function further comprises the step of:
ORing together actual logic levels of the first capacitor electrode of each capacitor to produce a second output where the stuck at logic level one failure is detected if the second output is at logic level one.

19. The method according to claim 14 further comprising the step of:
asserting a test output signal if at least one of the stuck at logic level zero failure and the stuck at logic level one failure has been detected.

20. The method according to claim 19 wherein the step of asserting a test output signal further comprises the step of:
using a logical exclusive-OR function.

* * * * *